United States Patent [19]

Koai et al.

[11] Patent Number: 5,289,480
[45] Date of Patent: Feb. 22, 1994

[54] TRIPLE-FUNCTION SEMICONDUCTOR LASER AMPLIFIER

[75] Inventors: Kwang-Tsai Koai, Concord; Robert Olshansky, Wayland, both of Mass.

[73] Assignee: GTE Laboratories Incorporated, Waltham, Mass.

[21] Appl. No.: 13,505

[22] Filed: Feb. 3, 1993

[51] Int. Cl.[5] .................................. H01S 3/00
[52] U.S. Cl. .............................. 372/38; 372/26; 372/29; 372/31
[58] Field of Search ............ 372/38, 26, 29, 31

[56] References Cited

U.S. PATENT DOCUMENTS 4,958,354  9/1990  Urakami et al. ................ 372/29
5,128,950  7/1992  Tsuchiya et al. ................ 372/38
5,140,603  8/1992  Anderson, Jr. et al. .......... 372/38

Primary Examiner—Georgia Y. Epps
Attorney, Agent, or Firm—Lawrence E. Monks

[57] ABSTRACT

An optoelectronic device is disclosed utilizing a semiconductor laser amplifier that provides for simultaneous detection, amplification, and modulation of an input optical signal. In one embodiment, an electronic transmitter and receiver are coupled to the semiconductor laser amplifier through an RF circulator. In an alternative embodiment, the electronic transmitter and receiver are coupled to the semiconductor laser amplifier through an RF power splitter with frequency or phase discriminating circuitry.

5 Claims, 2 Drawing Sheets

TRIPLE-FUNCTION SEMICONDUCTOR LASER AMPLIFIER

FIELD OF THE INVENTION

This application relates generally to semiconductor lasers, and more particularly to semiconductor lasers which can be used to simultaneously amplify, detect, and transmit an optical signal.

BACKGROUND OF THE INVENTION

Using semiconductor laser amplifiers (SLA's) as optical modulators, detectors, and multi-function network devices has recently received considerable interest in communications research. The use of an SLA as an optical signal amplifier is generally described by N. A. Olsson in "Lightwave Systems with Optical Amplifiers", *Journal of Lightwave Technology*, Vol. 7, 1989, pp. 1017–1082. In such use, the SLA amplifies relatively weak optical signals giving an strong output optical signal.

The use of SLA's as a simultaneous optical signal amplifier and detector has previously been described by A. Alping et al. in "100 Mbit/s Laser Diode Terminal with Optical Gain for Fiber Optic Local area Networks", *Electronics Letters*, Vol. 20, 1990, pp. 794–795, M. Gustavsson et al. in "Traveling Wave Semiconductor Laser amplifier detectors", *Journal of Lightwave Technology*, Vol. 8, 1990, pp. 610–617, and K. Koai et al. in Dual-Function Semiconductor Laser Amplifier in a Broadband Subcarrier Multiplexed System, *IEEE Photonics Technical Letters*, Vol. 2, 1990, pp. 926–928. In this application, the terminal voltage response of the SLA is electrically amplified and processed to detect information modulated on the optical carrier while it is being amplified.

An SLA has also been configured as an external modulator for data encoding with gain as described by U. Koren et al. in "High Frequency Modulation of Strained-layer Multiple Quantum-well Optical Amplifiers", *Optical Fiber Communication Conference*, OFC'91, San Diego, Calif., paper Th12, by G. Eisenstein et al. in "A Multiple Quantum Well Optical Amplifier/Modulator Integrated with a Tunable DFB Laser", *International Conference on Integrated Optics and Optical Communications*, Kobe, Japan, 1989, paper 19C2-3, and by G. Joyce et al. in "Wide Band Phase Modulation of a Semiconductor Amplifier", *16th European Conference on Optical Communication*, 1990, paper TuF2.5. However, in the Koren and Eisenstein papers the quantum well SLA's were integrated with laser diodes and did not function as in-line optical amplifiers. In the Joyce paper, the SLA was used as a phase modulator and not as an intensity modulator.

For network applications, an in-line SLA that acts not only as a linear amplifier for the complete optical carrier but also as a simultaneous transmitter and receiver for selected channels is particularly desirable.

OBJECTS OF THE INVENTION

It is a primary object of the instant invention to obviate the above noted disadvantages of the prior art.

It is further object of the instant invention to provide for a semiconductor amplifier which is utilized to simultaneously amplify, detect, and transmit an optical signal.

SUMMARY OF THE INVENTION

These and other objects and advantages are achieved in one aspect of the invention wherein a device utilizing a semiconductor laser amplifier is dc biased to provide amplification of an optical input signal while simultaneously modulating and detecting the amplified signal. The transmitted carrier signal and the detected amplified signal are isolated using a RF circulator or a RF power splitter with either frequency or phase discriminating circuitry. The circuitry for transmitting the carrier signal to the semiconductor laser amplifier and the electronics for receiving the detected signal are impedance matched to the semiconductor laser amplifier using a low impedance to 50-ohm transformer so as to reduce electrical reflection at the detector thus increasing detector sensitivity. Such devices may be advantageously used as transceivers for separate control and service channels in broadband digital networks or for data and video channels in subcarrier multiple-access networks.

DETAILED DESCRIPTION OF THE INVENTION

Figure 1:
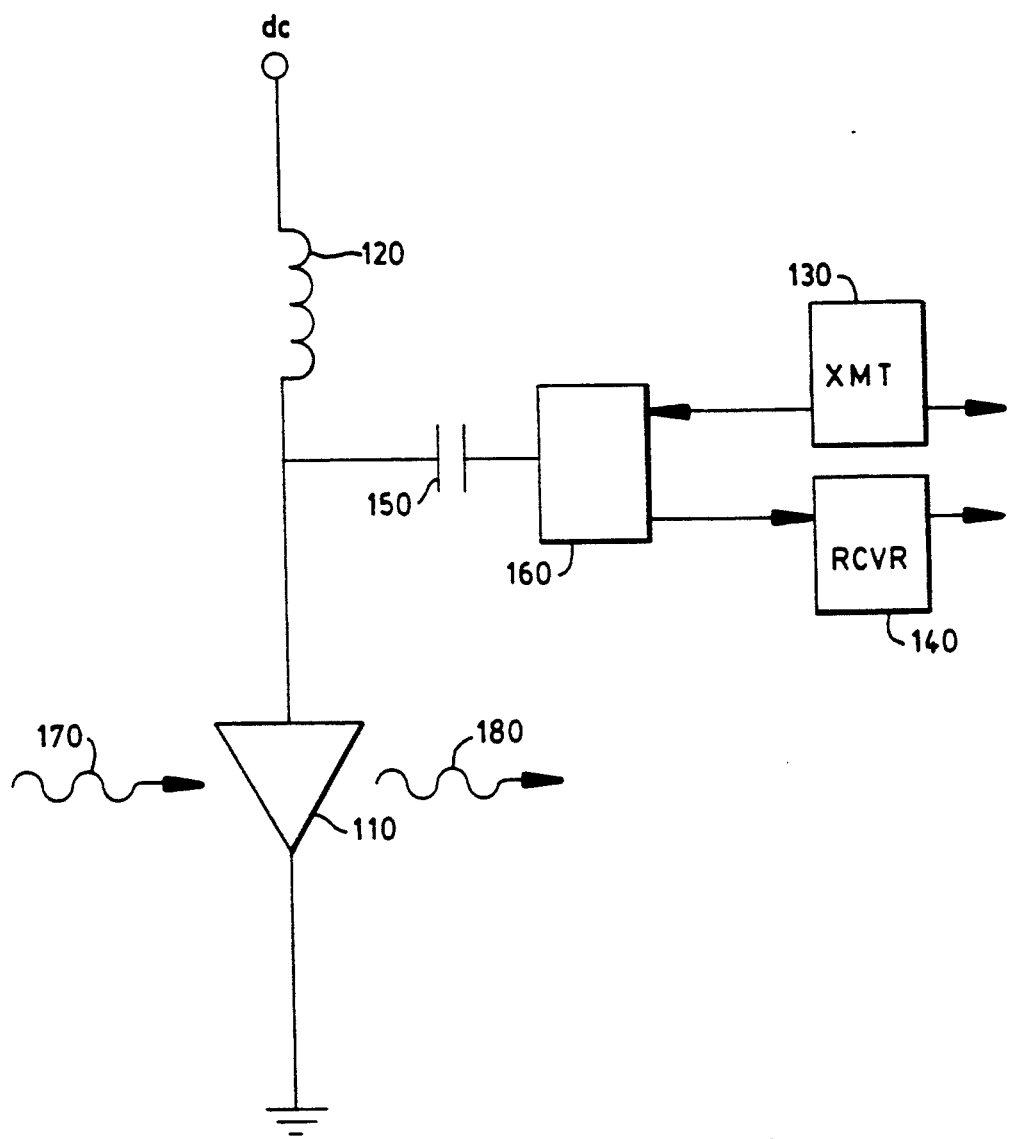
FIG. 1 is a depiction of a semiconductor laser amplifier used to simultaneously amplify, detect, and transmit an optical signal in accordance with the instant invention.

In FIG. 1 is depicted a device utilizing a semiconductor laser amplifier 110, an SLA, that provides for simultaneous amplification, detection, and transmission in the form of modulation of an input optical signal in accordance with the present invention. SLA 110 may be a near traveling wave (NTW) semiconductor laser amplifier consisting of a buried hetero-structure laser diode with anti-reflection coatings and having a gain ripple of 3-dB for TE-mode input when biased at 45 mA. SLA 110 is DC biased through inductor 120. SLA 110 is directly ac-coupled to an electronic transmitter circuit 130 and an electronic receiver circuit 140 through a capacitor 150 and isolation circuit 160. Electronic transmitter circuit 130 provides an electrical signal for modulation of the input optical signal 170 by SLA 110, and electronic receiver 140 is a receiver for detection of the amplified optical output signal 180. Both electronic transmitter circuit 130 and electronic receiver circuit 140 are conventional and known to those of ordinary skill in the art. Both electronic transmitter circuit 130 and electronic receiver circuit 140 have a 50-ohm input and output impedance. Isolation circuit 160 isolates the transmitted signal of electronic transmitter 130 from the received signal of electronic receiver 140. Since SLA 110 is a low impedance device, SLA 110 is ac-coupled to electronic transmitter circuit 130 and electronic receiver circuit 140 through a low impedance to 50-ohm transformer for reducing electrical reflection and thus improving the detection sensitivity.

Figure 2A:
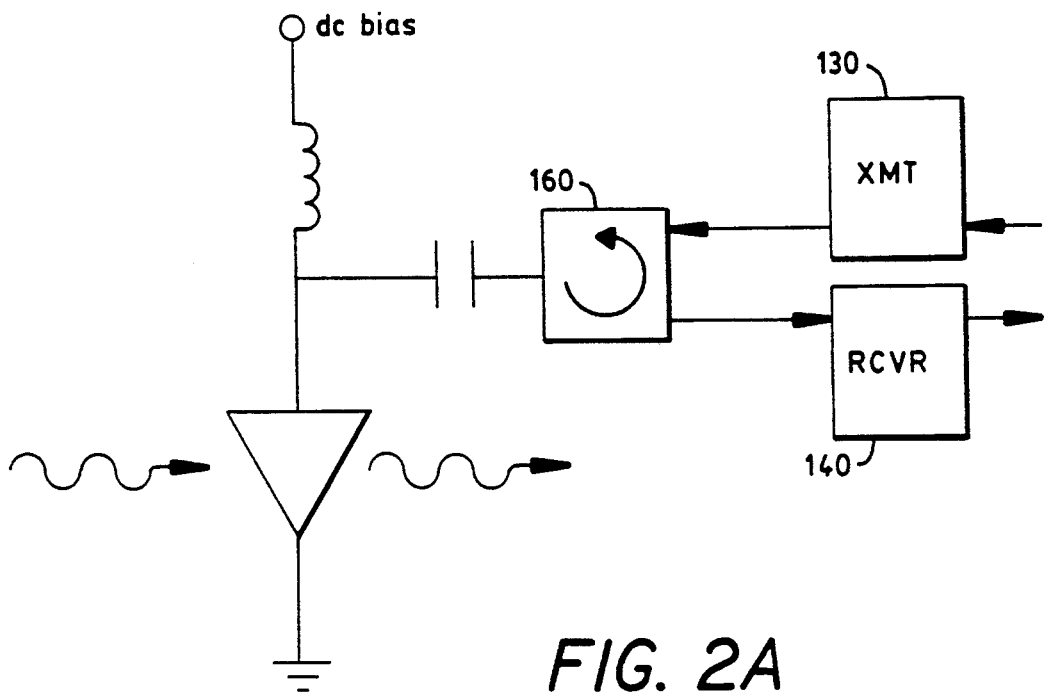
FIG. 2A is a depiction of a semiconductor laser amplifier used to simultaneously amplify, detect, and transmit an optical signal using an RF circulator to isolate the transmitted signal from the received signal in accordance with the instant invention.

In FIG. 2a is shown an embodiment of the current invention in which isolation circuit 160 is depicted an a RF circulator for separating the transmitted signal of electronic transmitter 130 from the received signal of electronic receiver 140.

Figure 2B:
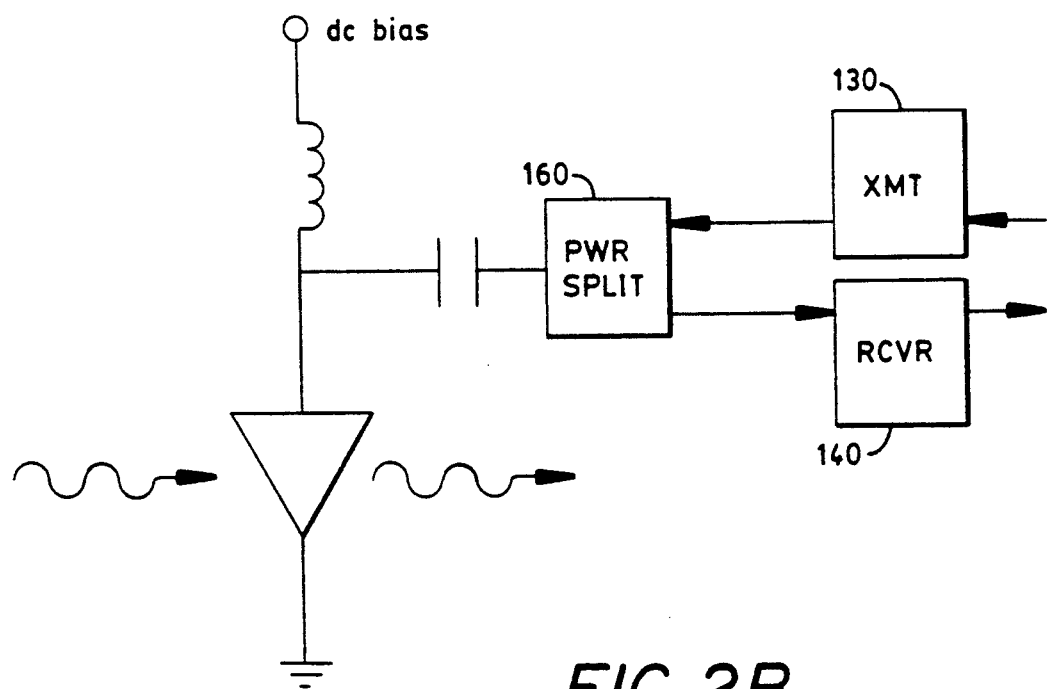
FIG. 2B is a depiction of a semiconductor laser amplifier to simultaneously amplify, detect, and transmit an optical signal using an RF power splitter with either frequency or phase discriminating circuitry to isolate the transmitted signal from the received signal in accordance with the instant invention.

In FIG. 2b is shown a further embodiment of the current invention in which isolation circuit 160 is depicted an a RF power splitter with either frequency or phase discriminating circuitry for separating the transmitted signal of electronic transmitter 130 from the received signal of electronic receiver 140.

While there has been shown and described what is at present considered the preferred embodiment of the invention it will be obvious to those skilled in the art that various changes and modifications may be made therein without departing from the invention as defined by the appended claims.

What is claimed is:

1. An optoelectronic device comprising:
 a semiconductor laser amplifier means for amplifying an input optical signal producing an amplified output optical signal;
 an electronic transmitter means for providing an electrical signal to said semiconductor laser means for modulating said amplified output optical signal;
 an electronic receiver means for detecting said input optical signal;
 an isolator means for isolating said signal of the electronic transmitter means from said detected input optical signal;
 wherein said device simultaneously detects the input optical signal, amplifies the input optical signal, and produces a modulated amplified output optical signal.

2. The optoelectronic device of claim 1 wherein the semiconductor laser amplifier is a buried hetero-structure laser diode with antireflection coatings.

3. The optoelectronic device of claim 1 wherein said isolator means is RF circulator.

4. The optoelectronic device of claim 1 wherein said isolator means is a RF power splitter having a frequency discriminating circuit.

5. The optoelectronic device of claim 1 wherein said isolator means is a RF power splitter having a phase discriminating circuit.

* * * * *